(12) United States Patent
Keller, III et al.

(10) Patent No.: US 11,105,868 B2
(45) Date of Patent: Aug. 31, 2021

(54) INTEGRATED DATA BUS RF SIGNATURE EXTRACTION AND AMPLIFICATION

(71) Applicant: NOKOMIS, INC., Charleroi, PA (US)

(72) Inventors: Walter J Keller, III, Brigeville, PA (US); Adam Taylor Brant, Eighty Four, PA (US); Andrew Richard Portune, Oakdale, PA (US); James Robert Uplinger, II, Cranberry Township, PA (US); Todd Eric Chornenky, Carmichaels, PA (US)

( * ) Notice: Subject to any disclaimer, the term of this patent is extended or adjusted under 35 U.S.C. 154(b) by 0 days.

(21) Appl. No.: 16/797,803

(22) Filed: Feb. 21, 2020

(65) Prior Publication Data

US 2021/0239776 A1 Aug. 5, 2021

Related U.S. Application Data

(60) Provisional application No. 62/969,456, filed on Feb. 3, 2020.

(51) Int. Cl.
*G01R 33/34* (2006.01)
*H01F 41/00* (2006.01)
*H01F 41/079* (2016.01)
*G01R 33/341* (2006.01)

(52) U.S. Cl.
CPC ..... *G01R 33/34007* (2013.01); *G01R 33/341* (2013.01); *H01F 41/005* (2013.01); *H01F 41/079* (2016.01)

(58) Field of Classification Search
CPC ........... G01R 33/34007; G01R 33/341; H01F 41/005; H01F 41/079
See application file for complete search history.

(56) References Cited

U.S. PATENT DOCUMENTS 10,235,523 B1 * 3/2019 Keller, III ........... G06F 13/4282

* cited by examiner

*Primary Examiner* — G. M. A Hyder
(74) *Attorney, Agent, or Firm* — AP Patents

(57) ABSTRACT

A device to extract digital and unintended analog signals from a data bus with a non-contact common mode probe and a differential mode probe, each with a low noise amplifier. The analog and digital signals can be monitored contemporaneously.

24 Claims, 24 Drawing Sheets

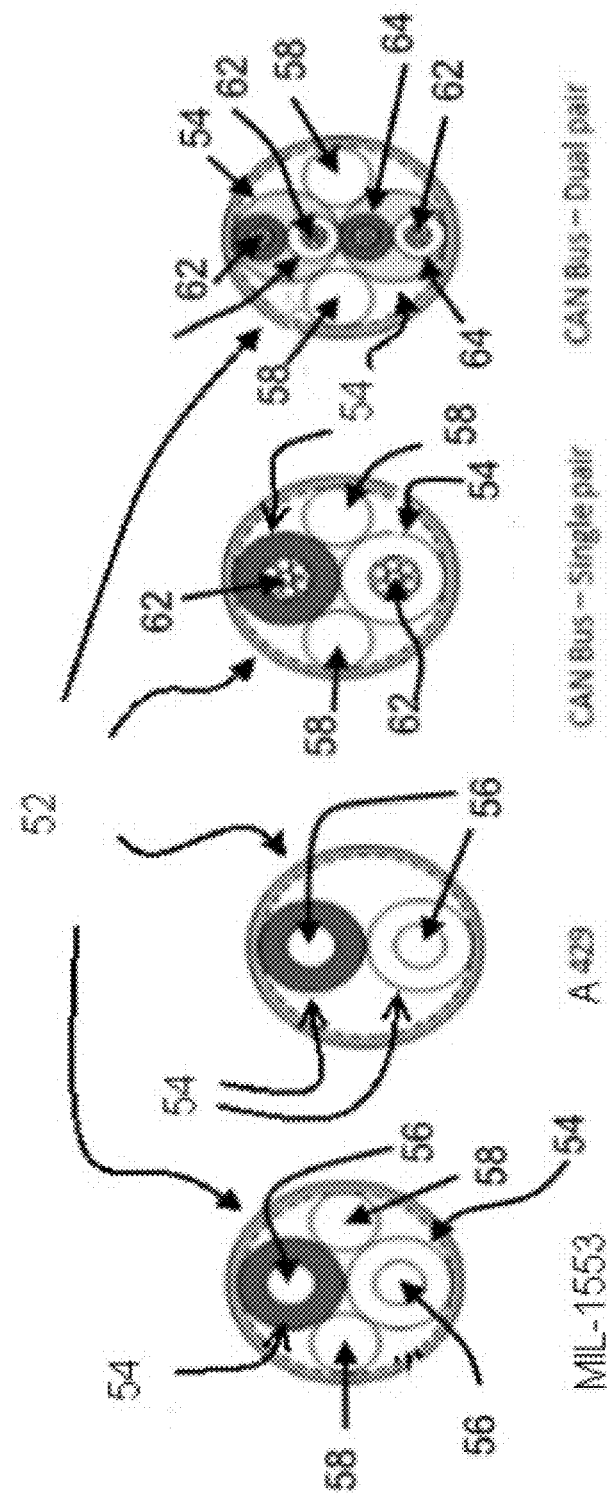

INTEGRATED DATA BUS RF SIGNATURE EXTRACTION AND AMPLIFICATION

RELATED APPLICATIONS

This application claims priority from US Provisional Application entitled DATA BUS COUPLER, Ser. No. 62/969,456, filed on Feb. 3, 2020, is incorporated by reference in its entirety.

FEDERALLY SPONSORED RESEARCH OR DEVELOPMENT

Navy Contract No. N68335-16-C-0108
Air Force Contract No. FA-8134-20-C-0001

REFERENCE TO SEQUENCE LISTING, A TABLE, OR A COMPUTER PROGRAM LISTING COMPACT DISC APPENDIX

N/A

BACKGROUND OF INVENTION

Data communication systems transmit data over internal and external data busses. Data buses are used in networked avionics in both commercial and military aircraft, transportation, networking and communications.

Beginning in the 1970s, the United States Department of Defense promulgated a standard for data buses known as MIL-STD-1553 data bus. The MIL-STD-1553 data bus standard has specifications for the physical bus, its network architecture, protocol, electrical signal characteristics, signal timing, and device connections to the MIL-STD-1553 data bus. The MIL-STD-1553 data bus standard provides standards for bus coupler operations, network protocols, and signal integrity. The MIL-STD-1553 data bus is a serial communication bus that generally operates at 1 megabit per second (MBPS). The MIL-STD-1553 data bus conventionally uses a standardized two strand shielded coaxial cable with an impedance of 78Ω.

Cross sections of data bus cables are shown in FIGS. 17A-D and FIG. 18 A-C. The buses have variety of conductors 56 and multifilament conductors 62. They are wrapped in shields 54 and jackets 64. They are contained in shielding 52 and some have spacers 58.

Additional buses or network architecture have evolved such as the Aeronautical Radio, Inc. ("ARINC") 429 ("A429"). The A429 bus uses a twisted pair shielded cable pair. It is a unidirectional data bus that operates at a frequency of around 100 kBPS. The A429 use a twisted wire pair and is unidirectional for transmit and receive, that is not transmitting and receiving simultaneously. Similarly, it has specifications for the physical bus, its network architecture, and device connections and bus coupler operations, network protocols, and signal integrity.

The A629 bus is used generally for aviation. The A629 bus operates at about 6 MBPS and is half duplex, transmitting in one direction at a time. It uses a twisted pair bus.

The Controller Area Network ("CAN 2.0") bus (including the ISO 11898-1, ISO 11898-2) is used in passenger vehicles, trucks, passenger buses (petroleum fueled vehicles and electric vehicles), agricultural equipment, electronic equipment for aviation and navigation, industrial automation and mechanical control, elevators, escalators, building automation, medical instruments and equipment. It operates at generally at a frequency of 4 MBPS using a two wire shielded twisted pair and is bidirectional. It has single and dual pair variants.

The Universal Service Bus ("USB") currently in its 3.0 version operates a about 2.4 GPS. The USB 2.0 operates at between 480 and 960 MBPS.

RF Links over Fiber ("RFLoF") is generally used as a communications bus that is bidirectional. It operates at around 434 MHz.

Optical Networks operate over fiber optical cables at approximately $10^5$ GHZ. Optical networks can be configured as active or passive and as bidirectional or unidirectional.

Universal Powerline Bus is used in home automation. It uses home wiring and in a U.S. system where AC power is 60 Hz, it uses a carrier of 120 Hz.

The ethernet bus typically operates at 10 MBPS, 100 MBPS, 1 GBPS, or 10 GBPS. It has mufti-filament conductors in with 2 and 3 shielded conductors in shielded jackets and spacers to hold the jackets in place. The jackets are surrounded by shielding.

Each of these networks described above or any related network or data bus protocol operates at a certain bit rate per second approximately corresponding to a frequency or a series of frequencies. Nonetheless, the frequencies of operation where data is sent back and forth on the network is a relatively narrow band compared to the entire Radio Frequency (RF) band, which is defined as covering the entire band from 20 kHz to 300 GHz. However, there is substantial information that is contained on the bus outside the intended narrowband frequencies of operation that have not been exploited heretofore. This information is typically in the form of unintended emissions or unintentionally leaked RF signatures or propagated indicators from the devices connected to the network or bus. In addition to capturing the in-band communication bitstream the described invention captures a much larger bandwidth of unintentional information that unintentionally leaks or is propagated over the bus or other communication medium. The bandwidth collected to capture these additional signatures is much broader than the intended communication bandwidth. For example, in one embodiment the frequency of communication bandwidth operation is 5 MHz with a BPS of less than 1 MBPS, whereas the bandwidth that is collected out-of-band is approximately 3 GHz or 3000 times as much bandwidth. The described invention at least one of captures or amplifies these emissions for use in cyber security, cyber-monitoring, health monitoring, intrusion detection, fraud detection, counterfeit detection, Remaining Useful Life (RUL), status monitoring, fault detection or quality control.

To capture at least one of narrow-band or wide-band RF energy a unique approach provides for coupling of RF energy over the RF spectrum as needed for signature extraction of metrics that inform the user about the state of the electronics attached to the bus or network. The coupling network must be configured to not degrade the communications of the bus of network protocols.

In the transformer coupled arrangement, for the MIL-STD-1553 data bus, FIG. 22A, the shielding 71 is shown for the bus and coupler. The shielded wires are typically unshielded only within a shielded box. The data bus wires are each connected to relatively high resistance isolation resistors 82 and then to the windings of a coupling transformer. The bus coupler previously known in the art uses an isolating transformer coupling the data bus by electrical induction passing signals at the operational frequency to networked devices. This prior art bus's two wire cables are connected to the transformer primary windings. The transformer windings are attached to the corresponding windings at an extended predetermined stub distance. The coupling transformer extended winding are coupled to and second isolating transformer that is connected to at least one Line Replaceable Unit ("LRU") terminal transmitter/receiver. This is exemplary for a connection. This configuration facilitates the tapping of the bus to extract the communication bitstream for a number of applications including status monitoring of the bitstream.

The direct connection of a bus coupler, FIG. 22B, typically uses isolating resistors and all of the isolating transformer windings are within a shielded LRU.

BRIEF SUMMARY OF INVENTION

The technical problem is to monitor a network data bus for analog electromagnetic signatures that can be continuous, transient, intermittent, temporary, or steady state and indicative of LRU or network anomalies including network LRUs, cyber compromise, cyber intrusion and component health. A second technical problem that is addressed is combining the results of at least one of communications or bitstream monitoring with at least one analog signature monitoring capability to arrive at better anomaly detection. Combining two communication bus monitoring techniques allows for a higher Probability of Detection (PD) and lowered False Alarm Rates (FAR) of abnormal electronic behavior than are possible by using standard single bus communication techniques alone.

The combination of monitoring the intended digital communication stream and several signature based analog conducted or radiated RF indicators simultaneously provides a powerful capability to detect cyber intrusions, to monitor cyber events and to monitor the health of a part, board, LRU, subsystem or system.

Monitoring the unintended RF spectrum content of the data bus in the transmission of digital pulse packet communications on the bus reveals the variations in the electromagnetic field around the data bus cables. These can be considered as weak (<10 nW), analog electromagnetic transients or analog signatures which can be characterized. The emitted analog signals from variations in the electromagnetic field are not an intended output of the bus and can reveal the internal activity of the LRUs connected to the data bus. It is impossible despite best design practices to completely remove these analog signals. These unintended RF emissions provide a signature pattern that can be measured and changes in signatures can be identified. This signature can be acquired from both the in-band (5 MHz for the MIL-STD-1553 data bus) and out of band content not related specifically to the communication signal on the bus because the signature or signature partial segment typically focuses on the unintended emissions from the bus, no matter the emission origin or interaction of emissions from components and/or LRUs on the data bus. The out-of-band unintended RF emission pattern signature could be at a frequency lower than the communications signal or substantially higher than the communication signal. The captured content of the information that is out-of-band of the communications bitstream, is at least one of related to, not related to, or causally related to the digital data being transmitted over the bus or network and is also an advancement of the described device.

The monitoring of the analog electromagnetic signatures is typically done simultaneously with the monitoring of the intended digital communication stream. However, the monitoring of analog electromagnetic signatures can also be done independently from digital communications. The monitoring of the unintended analog electromagnetic signatures can also be done while monitoring an intended analog communication stream, but on the MIL-STD-1553 data bus and most communication protocols the data stream being monitored is typically digital.

In a preferred configuration the probe collects one or more digital communication data streams, one or more analog common mode analog signatures or one or more differential mode analog signatures, where the digital communications are intended communication and the common mode and differential mode collections are unintended leaking of energy in the RF regime that provides indicators of the state of the electronics that are leaking the RF energy. It should be noted that the monitoring of only the digital intended communications is also contemplated, and only the analog common mode signatures is also contemplated, or only the differential mode analog signatures is also contemplated. However, it is also contemplated to monitor the combination of one or more of each of these collection mechanisms providing the opportunity for improved performance. Component health can be at the part, board, subsystem, or system level. The monitoring is consistent with the constraints of the Bus being measured, one example being MIL-STD-1553 data bus. The physical environment in which the bus operates includes size and weight considerations for applications such as avionics, ground vehicles or other devices that have a data bus. The invention is embodied in a size, weight, volume, and power requirements suitable for the aircraft or vehicle. It minimally affects the aircraft or vehicle use, operation, available payload, while minimizing the requirements for installation. The invention is designed to be installed or retrofitted with minimal impact or modifications. The monitoring does not degrade or compromise the transmitted data or compromise data integrity or security.

| | | | |
|---|---|---|---|
| Network bus couplers shall maintain coupling transformer ratio of | 1.41:1 +/−1% | unitless | Coupling Transformer Ratio |
| Coupling transformer input impedance shall be | >3000 from 0.075-1 MHz using 1 Vrms sine | Ω | Coupling Transform Input Impedance |
| Coupling transformer common mode rejection level shall be | >45.0 dB @ 1.0 MHz | dB | Coupling Transformer Common Mode Rejection |
| Isolation resistor impedance shall be | 0.75 Zo ± 2.0%, Zo = bus impedance at 1 MHz | Ω | Stub Isolation Resistor Impedance |
| RF channel isolation between common mode and differential mode probes shall be | >70 dB | dB | RF Channel Isolation |

Additionally, to meet the size, weight, and power requirements of bus coupler used for the MIL-STD-1553 data bus, for use in avionic applications it must meet the following physical requirements:

| Requirement | Value | Units | Name |
| --- | --- | --- | --- |
| The coupler box length shall not exceed | 60 | mm | Coupler Length |
| The coupler box width shall not exceed | 30 | mm | Coupler Width |
| The coupler box height shall not exceed | 30 | mm | Coupler Height |
| The maximum survivable temperature of all components shall not be less than | 125 | ° C. | Maximum Survivable Temperature |
| The minimum survivable temperature of all components shall not exceed | −55 | ° C. | Minimum Survivable Temperature |
| Operating temperature inside coupler may not exceed | 80 | ° C. | Operational Environment's Maximum Temperature |
| Operating temperature inside coupler may not be less than | −40 | ° C. | Operational Environment's Minimum Temperature |

Differential mode currents exist in current-carrying circuits, even under ideal conditions. The differential mode current in circuits flow in opposite directions as it travels through the closed loop of the circuit. It can also be thought of as a current going in one direction on one conductor and the other conductor being at least one of a reference or a ground. The fields generated by each current on each conductor can be captured independently or the difference between the currents captured via at least one of inductive or capacitive coupling. A direct connection can also be established instead of inductive or capacitive coupling, but balancing of the circuit is then required.

Common-mode currents are currents that flow in the same direction over two or more conductors simultaneously. Common mode is sometime referred to as the "parasitic" currents that become part of a circuit after they "couple" into the circuits from other sources (e.g., other nearby circuits using the same ground plane) through parasitic components such as capacitances to ground. Common mode currents can be generated directly at the Integrated Circuit (IC) level, board level or at interfaces between boards or systems. One trait that is common is that multiple currents on one or more conductors are refencing the same ground potential as they try to return to that ground or the lowest energy state. Common mode currents travels in the same direction on each of the conductors. Therefore, the generated electric fields will add, rather than subtract.

The present device monitoring conducted emissions may use one or more of a common mode probe (CMP) and/or one or more of a differential mode probe (DMP) to capture these two distinctly different emission characteristics. The CMP can be configured to collect the analog RF signatures capacitively or inductively or as a combination of capacitive and inductive elements. The DMP can be configured to collect the analog RF signatures capacitively or inductively or as a combination of capacitive and inductive elements.

A preferred embodiment of the present device collects common mode signatures using magnetic induction as the primary mechanism and secondary collection method of capacitively inducted energy from the monitored data bus. A preferred embodiment of the present device collects differential signatures using magnetic induction as the primary mechanism, with a secondary collection method of collecting capacitively inducted energy from the bus being monitored. Some embodiments acquiring the CMP and DMP components of the device may be configured to collect purely inductive coupled energy and/or capacitively coupled energy. In the case of the inductive collection the measurement is typically a current measurement or a voltage measurement of a current through a resistor whereas the capacitively inducted measurements are typically direct voltage measurements.

In a preferred embodiment the probes are characterized as having small generally toroidal magnetic cores, preferably ferrite cores, with a number of windings comprising the unshielded data bus wires within a bus coupler. The probes' changing voltage outputs are captured and each independently amplified by multiple, generally or immediately adjacent high gain, low noise amplifiers (LNA). In a preferred embodiment the data bus coupler, with an isolating transformer, CMP, DMP, and corresponding LNAs for the probes are enclosed in a thermally and electrically conductive chassis 100 for RF shielding purposes and heat dissipation. Chassis 100 can be referred to as a box 100 or as a coupler box 100. In a preferred embodiment the data bus coupler, CMP, DMP, and corresponding LNAs for the probes are enclosed in a thermally and electrically conductive box for RF shielding and heat dissipation. In a preferred embodiment the data bus coupler, CMP, and corresponding LNAs for the probes are enclosed in a thermally and electrically conductive box for RF shielding and heat dissipation. In a preferred embodiment the data bus coupler, DMP, and corresponding LNAs for the probes are enclosed in a thermally and electrically conductive box for RF shielding and heat dissipation. In a preferred embodiment the data bus coupler, with a terminal block, CMP, DMP, and corresponding LNAs for the probes are enclosed in a thermally and electrically conductive box 100 for RF shielding purposes and heat dissipation. Though the system has been configured with minimal isolation, high levels of isolation between each CMP and DMP and the signal paths that flow from them to a dedicated LNA is maintained at a high level in the preferred embodiments.

An isolation control is at least one of contemplated or implemented by the invention. The coupling transformer is preferably attached to the thermally conductive coupler box 100 with a thermally conductive adhesive and/or an electrically conductive adhesive so that the enclosure acts as a heat sink and a shield to unrelated external electromagnetic noise. Similarly, the LNAs are also preferably attached to the coupler box 100 with a thermally conductive and electrically conductive adhesive so that the coupler box 100 acts as a heat sink and as a ground for the LNAs. The analog LNA output requires a high signal to noise ratio (SNR) such that the output can be analyzed for unintended emissions signatures on the data bus within the operational constraints and data bus standards, without degrading communication data integrity or compromising data security. The device allows for simultaneous and/or independent CMP and DMP data collection of the data bus while monitoring the digital signal of the data bus through a stub.

The ability to analyze unintended emissions signatures permits monitoring of system performance including avionics Line Replaceable Units (LRUs). This can be used to determine the occurrence of cyber-attacks or cyber compromise, physical compromise, counterfeit components, system health, determining component life cycles and Remaining Useful Life ("RUL"), and develop maintenance schedules.

In addition, the physical connection of the bus or network to at least one of systems, LRUs, WRAs or subsystems facilitates acquisition of the unintended conducted emissions containing substantial signature content that is not related to the communications message content, and is independent of the communication signals that are simultaneously occurring over the bus. These signatures may be related to emissions of least one of microcontrollers, microprocessors, power supplies, memory, FPGAs, programmable logic or any component that may be resident on a board of a subsystem that is connected to the bus or network. The configuration of the device described herein to facilitate the capture of this signature content is a major advancement in the art.

For the common mode probe the preferred range of frequencies of which the RE signatures are extracted and collected is 30 MHz to 3 GHz. However, it is clearly contemplated to extract and collect signatures through the entire RF frequency range from 20 kHz through 300 GHz. For the differential mode probe the operational frequencies preferably is between 30 MHz and 1 GHz. Although for both probes the range can be greater or lesser as noted through the range from 20 KHz through 300 GHz. Both probes preferably operate between −50° C. and 80° C. The coupling transformer that is defined by the MIL-STD-1553 data bus specifications is intended to pull the signal from the MIL-STD-1553 data bus couples with a ratio of 1.41:1 with an input impedance of >3000 and offers a common mode coupling rejection level of >45.0 dB@1.0 MHz. RF Channel Rejection is specified to be >70 dB. The isolation resistor impedance 0.75 times the Zo±2.0%, where Zo is the bus impedance at 1 MHz. The described differential mode and common mode signature extraction hardware elements work independently of the standard MIL-STD-1553 data bus coupling transformer to extract RF emissions and their resulting signatures from the bus that can be, but are typically not, part of the intentional communication protocols of the bus. In a preferred embodiment, the extraction elements are independent, with signal paths from those elements that independently amplify the collected information and independently process the information that result in multiple independent measures of anomalies on the bus or communication network.

The unintended electromagnetic signals may form signatures that provide information as to the health of the system, components, or fact or probabilistic indicators that the system is acting in an unexpected manner. The unintended analog signal variations could be due to parts aging, part replacement, part changes, cyber threats, cyber incursions, firmware changes, software changes, VDHL code changes, LRU replacement, additional LRU connections, faults or failures, or other software, firmware, or hardware changes. Difficulties in detecting these weak analog signals, along with physical constraints of size, weight, power, security, and signal integrity make it impractical to monitor these analog electromagnetic signatures with conventional bus couplers.

The use of the invention is shown in FIGS. 19A-19B, 20A-203, and 21A-21B. Note that LRUs 600, 601, 602, and 603 can be a combination of the same devices or different devices attached to the bus. The arrows show the bus communication direction. The bus 70 is connected to the LRUs 600-603. The invention power connection 72 and the outputs are the CMP output 74, DMP output 76 and the digital output 78. The figures show a one channel embodiment, but a multichannel embodiment is also contemplated.

One embodiment FIGS. 19A and 19B contains one or more LRUs 600-603 connected on one or more bus systems with one or more coupler boxes 100 inserted on the communication lines. A second embodiment of FIGS. 21A and 21 B is that of two separate bus communication networks, such as an ethernet and an ARINC 429 bus, in which the coupler boxes 100 are directly inserted between the two LRUs of each bus. The first coupler box 100 is configured to output common mode signal, and the second coupler box 100 is configured to output differential mode signals. Additionally, FIG. 21A is a set of LRUs 600-603 on two individual bus lines each in serial communication configuration with LRUs 602 and 603 being in a two way communication on one bus and LRUs 600 and 601 being in a one way communication on the second bus. One coupler box 100 is inserted into the bus line between LRU 600 and LRU 601, and another coupler box chassis is inserted between LRU 602 and LRU 603. The coupler boxes 100 have power inputs for the LNAs. Each coupler box 100 can be configured separately, such that one coupler box is supplying an output of the common mode and differential mode measurement and another coupler box is supplying an output of the differential mode measurement. A third embodiment of FIGS. 20A and 20B is that of the coupler box 100, connected to a central configuration in which any LRU 600-603, can communicate with any LRU 600-603, typically over a coaxial wire connection, such as a MIL-STD-1553 data bus configuration. In this embodiment the coupler box 100 is configured to output the common mode, differential mode, and digital communication signal. This can be likened to the well known star network configuration.

In another preferred embodiment there are multiple conductors in a network bundle. In this configuration there are at least two and likely multiple CMPs and DMPs that are monitoring different referenced voltages and currents within the bundled to capture multiple independent signature elements from each independent CMP and DMP. In one preferred configuration four CMPs and 3 DMPs are measuring the emissions over a combination of different conductors in the bundle. Each probe has a dedicated LNA and each signal path is analyzed independently and then the results fused by a computational means.

In another preferred configuration there are an arbitrary number of CMPs, DMPs and communication monitoring nodes connected to a multi-conductor bus or communication bundle depending on the number of conductors in the at least one of a bus or communication bundle. It should be noted that a preferred means to extract the comparison of signals such as the differential (DMP) mode is to first cancel them out in an analog circuit such as counterwound transformer windings, and then digitally encode the result rather than digitally encoding them first. This preferred means typically allows for more sensitivity, In another preferred configuration there are an arbitrary number of CMPs, DMPs and communication monitoring nodes connected to a multi-conductor bus or communication bundle depending on the number of conductors in the at least one bus or communication bundle.

BRIEF DESCRIPTION OF DRAWINGS

FIG. 17A illustrates a cross sectional view of a MIL-STD-1553 data bus cable.

FIG. 17B illustrates a cross sectional view of an A429 data base cable.

FIG. 17C illustrates a cross sectional view of a CAN Bus (single pair) data bus cable.

FIG. 17D illustrates a cross sectional view of a CAN Bus (double pair) data base cable.

DETAILED DESCRIPTION OF INVENTION

There are military and civilian standards, as well as operational constraints, that make it difficult to detect the weak analog signatures that are caused by changes in electrical activity in at least one of the time domain or frequency domain on the data bus of avionics systems and other vehicles. The present device extracts these analog signatures within a data bus coupler from the communication bus line. In a preferred configuration the acquired communications bitstream is simultaneously monitored in addition to the CMP and DMP signals. The CMP and DMP signals are independently amplified and output all within the weight and size requirements for applications such as avionics platforms without degrading the digital signal or compromising the signal's security. The probes are arranged to monitor analog signals contemporaneously.

Figure 1:
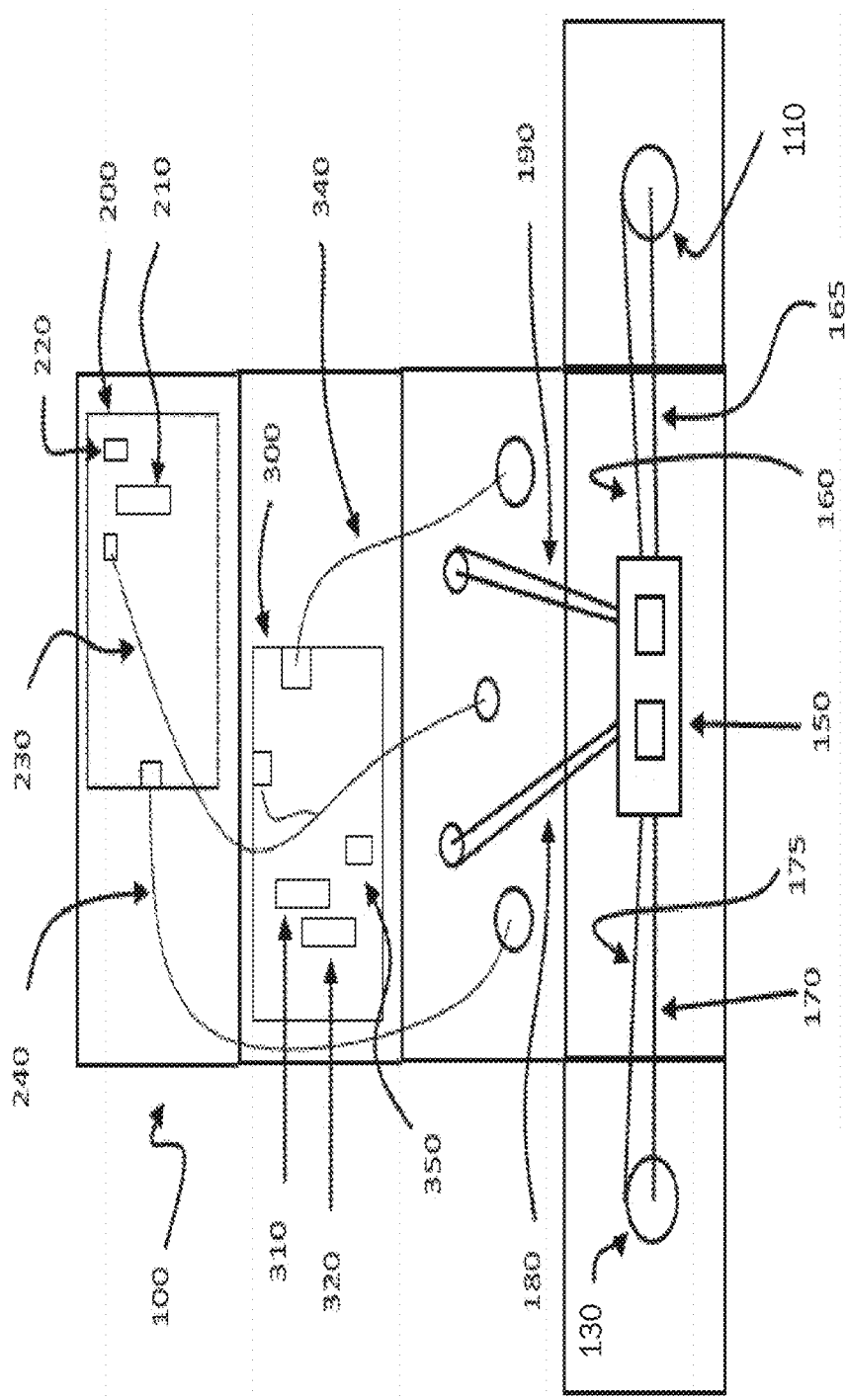
FIG. 1 illustrates a plan view of the device box, unfolded.

FIG. 1 shows an unfolded view of the shielded coupler box 100 that contains the elements of the device located on the interior surface of the coupler box 100. The coupler box 100 is a generally rectilinear container box though the box could have any shape. The coupler box 100 is preferably a thermally and electrically conductive material. The coupler box 100 is preferably less than 50 cubic inches in volume. The coupler box 100 has multiple apertures to preferably accommodate connectors through walls of the coupler box 100. The device has a power port to supply power to one or more low noise amplifiers (LNAs) 220, 350. One or more data bus input ports 110 through the wall of the coupler box 100 and one or more data bus output ports 130 through the wall of the coupler box 100 are preferably configured for connectors. Ports 180 and 190 are stubs. Input port 110 and output port 130 are the data bus ports. A preferred embodiment to couple to a MIL-STD-1553 data bus requires that the bus coupler provide electrical noise isolation between the data bus and the analog output channels. Preferably the invention uses an isolating transformer 150. The input port 110 is connected to the transformer 150 by communication cable wires 160 and 165 and the transformer 150 is connected by the two strand communication cable wires 170 and 175 to the output port 130. A preferred embodiment to couple to an ARINC 429 bus does not require electrical noise isolation, and will not utilize an isolating transformer 150.

The coupler box 100 is shown as having a port for transmitting signature data collected by a CMP and a port for transmitting signature data collected by a DMP and a port of extracting communications bitstream data for status monitoring. It is contemplated that the coupler box 100 could have any number of ports with any number of CMP outputs any number of DMP outputs and any number of communications bitstream outputs. For a specific case of a multi-shield communication cable more than one DMP may be installed to measure the differential mode signatures relative to each of the shields that are connected to different subsystems while monitoring one or more CMP may reference both the shields and/or the conductors within the shields.

To observe the analog signal of electromagnetic transients, the CMP has an inductive coil 210. While any inductive coil could be used, including solid cores, clam cores, air cores, preferably, the device uses a ferrite core and preferably a toroidal ferrite core.

As used in this application, generally toroidal refers to a ring type torpid meaning that is hollow. Generally toroidal includes a torus and other cores that are not a perfect geometric shape. Preferably, the magnetic core is manufactured of ferrite to provide increased sensitivity. Preferably, for MIL-STD-1553 data bus configuration the ferrite is a "68" material with the following specifications:

Initial magnetic permeability ($\mu$): 20
Saturation flux density (Bs): 2500 Gs
Residual flux density (Br): 700 Gs
Coercive Force (He): 7 Oe
Curie Temperature: 500° C.
AL factor: 6.6 nH/N2
Preferably the toroids have the following dimensions:
Dimensions (OD×ID×H): 12.7 mm×7.1 mm×4.8 mm An advantage of a generally toroidal inductive coil is that minimizes electromagnetic interference and magnetic flux leakage. When assembled, the toroid encircles the two strand communication cables 160 and 165. The two strand communication cables 160 and 165 are positioned within and are surrounded by the generally toroidal magnetic core 210 without contact. A non-contact CMP minimizes any impact to the bus or conductor being monitored and thereby minimizes compromising the digital communications integrity and security. Other similar configurations using differing toroid configurations are possible to achieve similar result while optimizing on other factors such as size, sensitivity, or rejection.

The generally toroidal magnetic CMP core 210 has one or more windings. Preferably, the generally toroidal magnetic core 210 has one winding. While more than one winding is operational, the use of one winding minimizes the impedance of the CMP, Adjacent LNA 220 is preferably in generally close proximity to the CMP core 210. The CMP LNA 220 has a power supply input from connector 230 and a RF output to connector 240. Preferably, the LNA 220 is mounted on a circuit board 200. The LNA 220 output and interconnect cable provide the analog RF signal to later construct the signature.

The DMP inductive coils 310, 320 are preferably positioned on the opposite side of the transformer 150 from the CMP. This allows room with a space constrained coupler box to fit in the box 100 without interfering with the CMP or LNAs. Preferably, the CMP and DMP LNAs are mounted on separate interior walls of the coupler box 100. The DMP has inductive cons 310 and 320. As described above for the CMP, a core of various shapes and materials can be used. Preferably, the DMP and CMP use a generally toroidal ferrite core. This provides increased sensitivity. Each of the generally toroidal ferrite cores has one or more windings. Similarly, as with the CMP core 210, it is preferable for each of the magnetic cores 310 and 320 to have one winding to minimize impedance. The DMP magnetic cores 310 and 320 are offset, as shown in FIG. 1. The offset allows the communication line strands 170 and 175 to be more easily separately threaded through the interior of the toroidal cores without contact.

The DMP has noncontact cores 310 and 320 with an associated LNA 350 adjacent, or near it. The LNA 350 has a power supply input 230, and RF output 340. Preferably, the DMP magnetic cores 310 and 320 are mounted adjacent near the DMP LNA 350 on a circuit board 300.

The LNAs 220 and 350 are positioned near the magnetic cores 210 for the CMP and 310 and 320 for the DMP, respectively, to improve performance and efficiently use the space available in applications such as avionics. The CMP circuit board 200 and DMP circuit board 300 are preferably attached to separate faces of the coupler box 100. Circuit boards 200 and 300 are preferably attached with thermo-conductive and electrical-conductive adhesive to the coupler box 100 that is also thereto-conductive and electrically conductive.

Figure 2:
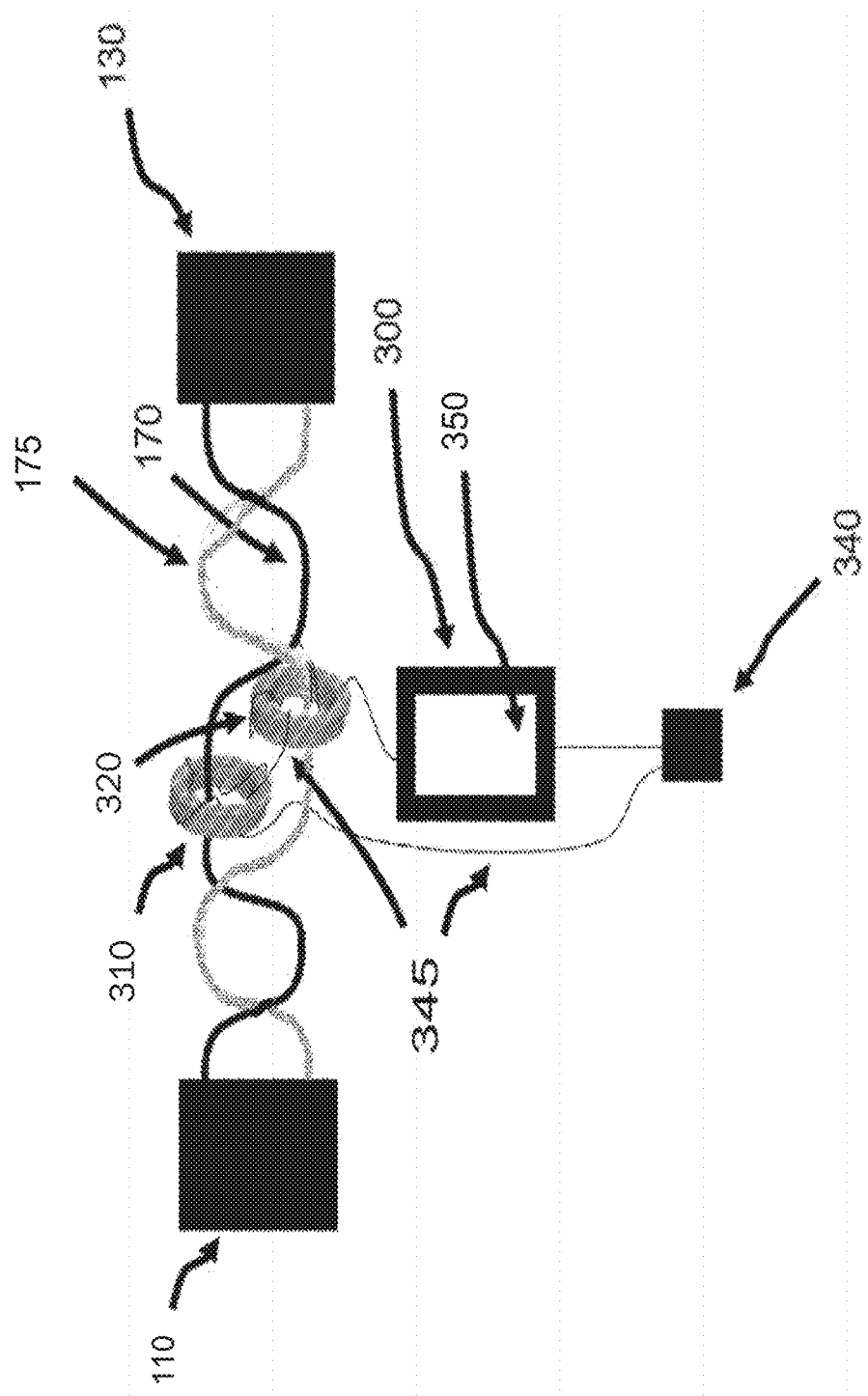
FIG. 2 illustrates a block diagram of the Differential Mode Probe.

FIG. 2 illustrates a block diagram of the DMP. A wire 345 is wound around the toroidal ferrite cores 310 and 320. LNA 350 is mounted on the circuit board 300.

Figure 3:
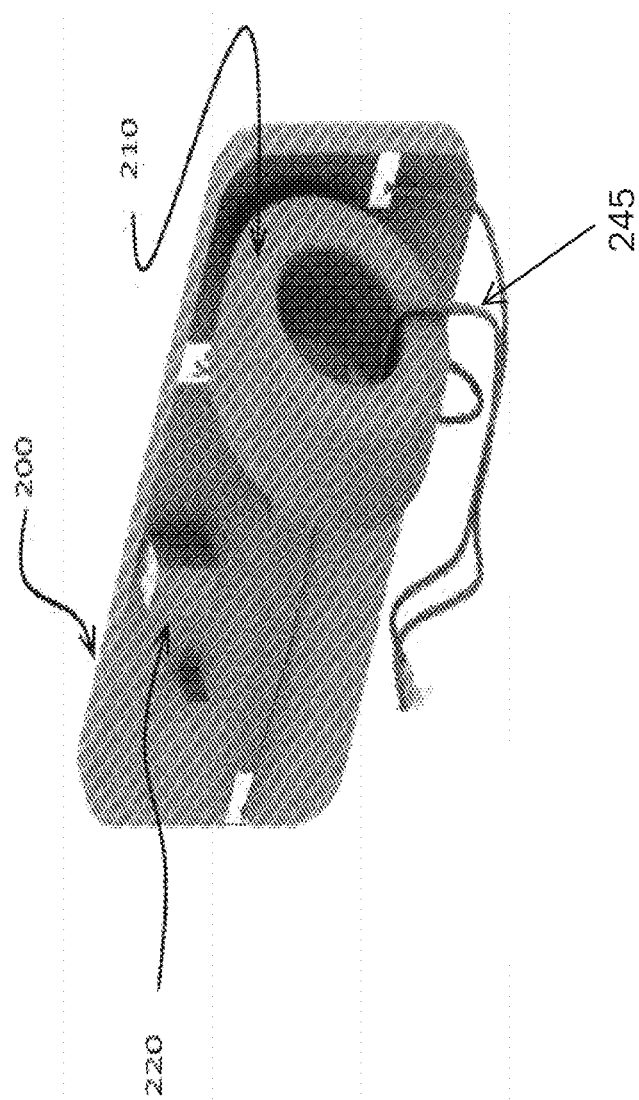
FIG. 3 illustrates a perspective view of the Common Mode Probe and Low Noise Amplifier Board.

FIG. 3 illustrates a perspective view of CMP. The LNA 220 is shown as attached to the circuit board 200, FIG. 3 shows a single wind of wire 245 around the generally toroidal ferrite core 210. The wire 245 connects to RF output 240.

Figure 4A:
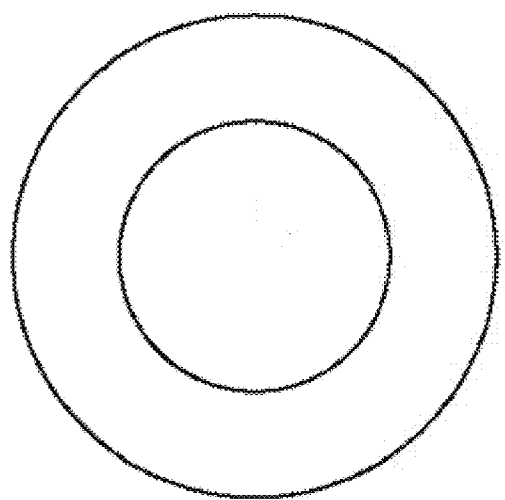
FIG. 4A illustrates a top view of a toroidal ferrite core.
Figure 4B:
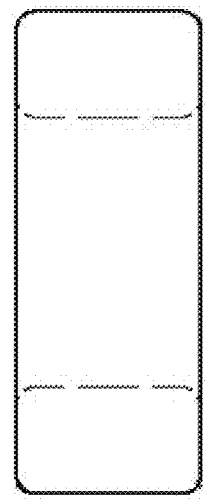
FIG. 4B illustrates a side view of a toroidal ferrite core.
Figure 4C:
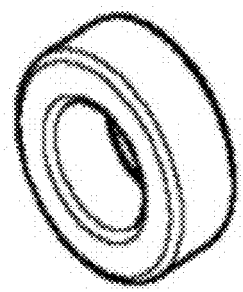
FIG. 4C illustrates a perspective view of a toroidal magnetic core.

FIGS. 4A-4C show the generally toroidal ferrite cores that are used in the CMP and DMP. The use of the generally toroidal is meant to include a torus. An illustration of toroidal cores is shown in the side views FIGS. 4A and 4B. An additional toroidal shape is shown in 4C where there is a chamfer in the transition between the top and side of the core.

Figure 5:
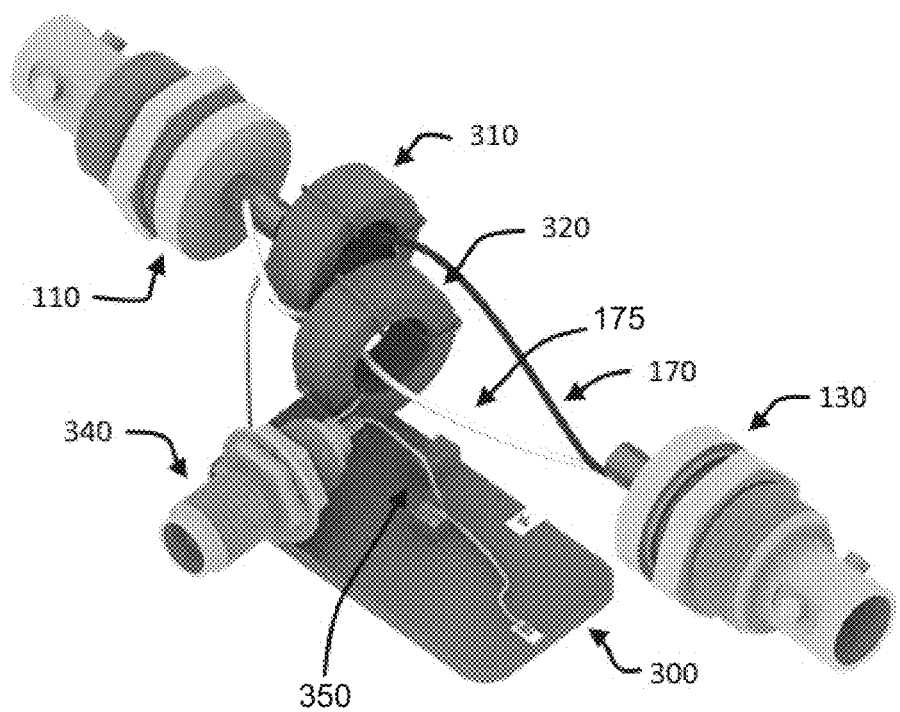
FIG. 5 illustrates a perspective cutaway view of the Differential Mode Probe and low noise amplifier board.

Turning to the DMP in FIG. 5, therein is illustrated a partial cutaway view without the coupler box 100, transformer 150, or CMP to illustrate the assembly of the DMP. In this view the SMA connectors carrying the data bus ports 110 and 130 are shown. The DMP is assembled with the two strand communications cable 170 and 175 that are each separately threaded within the generally toroidal magnetic cores 310 and 320. Note that the generally toroidal magnetic cores 310 and 320 are offset to receive the strands 170 and 175, respectively. This cutaway perspective view shows the DMP with three windings. The toroidal magnetic cores mounting on the circuit board is obscured on this view to more easily view the generally toroidal cores 310 and 320. The LNA 350 is mounted generally near the generally toroidal cores 310 and 320 to improve LNA performance. The power supply is not shown.

Figure 6:
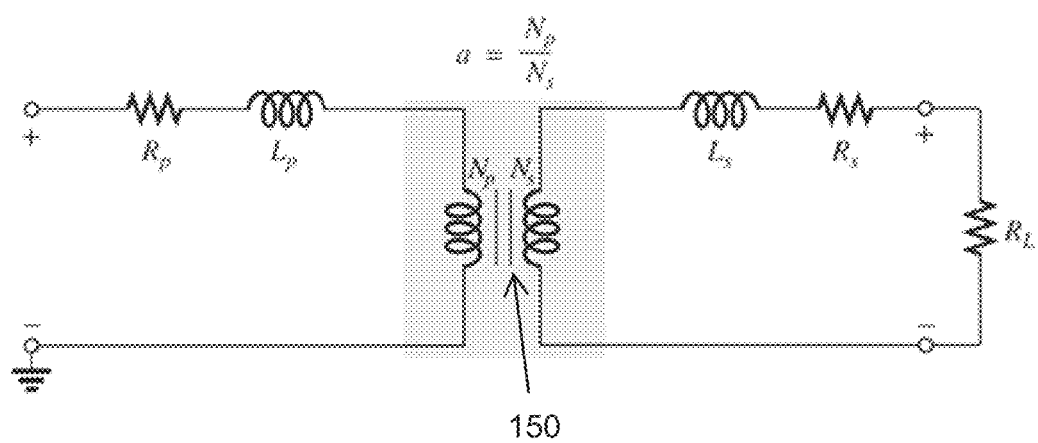
FIG. 6 illustrates a diagram of torpid CMP equivalent circuit diagram.

FIG. 6 is an equivalent circuit for transformers illustrating the primary and secondary windings. The purpose of transformer 150 is to isolate the data bus from the data bus coupler and is in the MIL-STD-1553 data bus specification for the LRU. The LRUs are avionics devices that are connected to the data bus. The data bus coupler provides stubs 180, 190 to connect the LRUs to the data bus. The data bus digital communications signals can be monitored through the stubs 180, 190. The monitoring would be by a separate board not shown. Np is the data bus through the ferrite core and Ns is the winding through the probe. RL is the resistance of 50Ω associated with an SMA connector.

Figure 7:
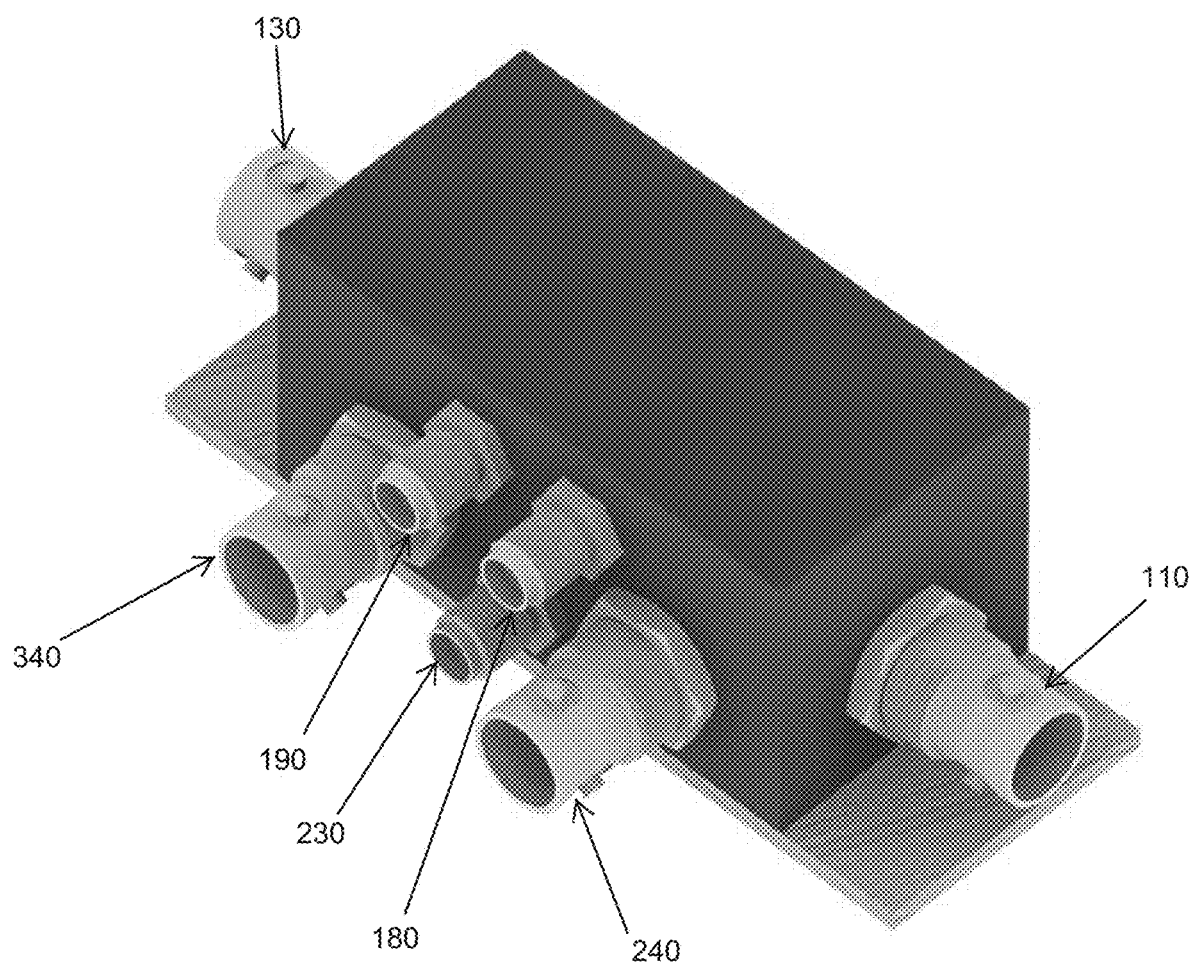
FIG. 7 illustrates a perspective view of the exterior of the bus coupler box.

FIG. 7 is a perspective view of the exterior of the device attached to the coupler box 100 showing the bus line ports, RF output 240 from CMP, RF output 340 from DMP, stubs 180 and 190, and power supply connection 230.

Figure 8:
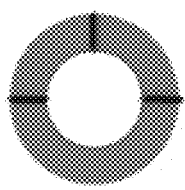
FIG. 8 illustrates a plan view of generally toroidal magnetic core.

FIG. 8 is a plan view of a generally toroidal magnetic core with three windings.

Figure 9:
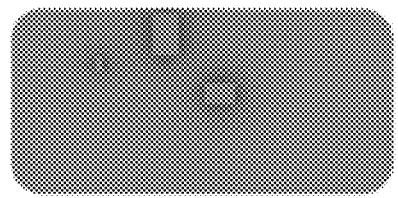
FIG. 9 illustrates a plan view of the CMP and CMP LNA circuit board.

FIG. 9 is a plan view of the circuit board with an LNA board.

Figure 10:
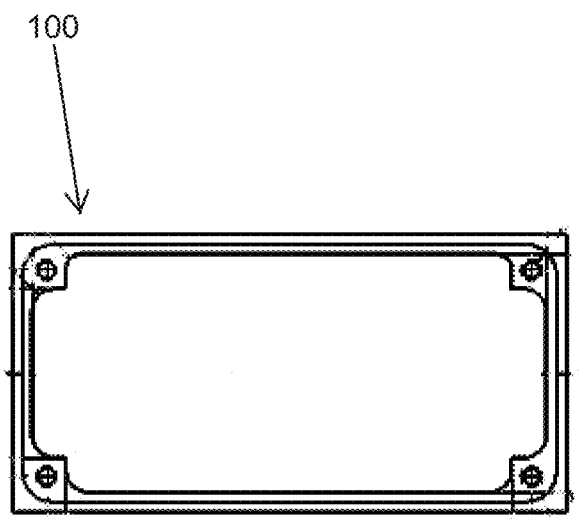
FIG. 10 illustrates a plan view of the box.

FIG. 10 is a top view of the device lid showing the coupler box 100 with the fasteners to complete assembly.

Figure 11:
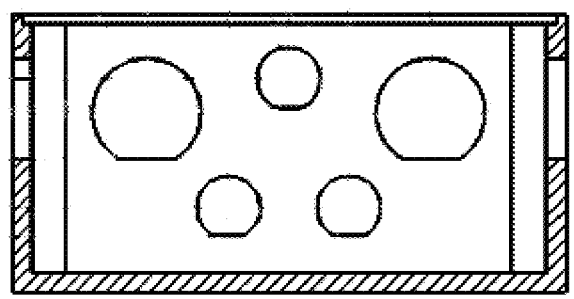
FIG. 11 illustrates an elevation view of the box.

FIG. 11 illustrates an elevation view of the coupler box 100.

Figure 12:
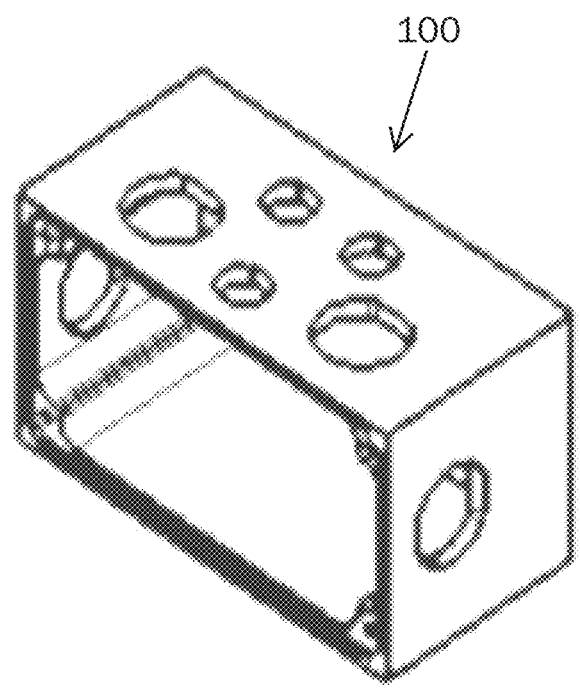
FIG. 12 illustrates a perspective view of the box.

FIG. 12 illustrates a perspective view of the coupler box 100 showing the cut outs for connectors for the input and output ports, LNA RF outputs for the CMP and DMP, stubs and the power supply.

Figure 13:
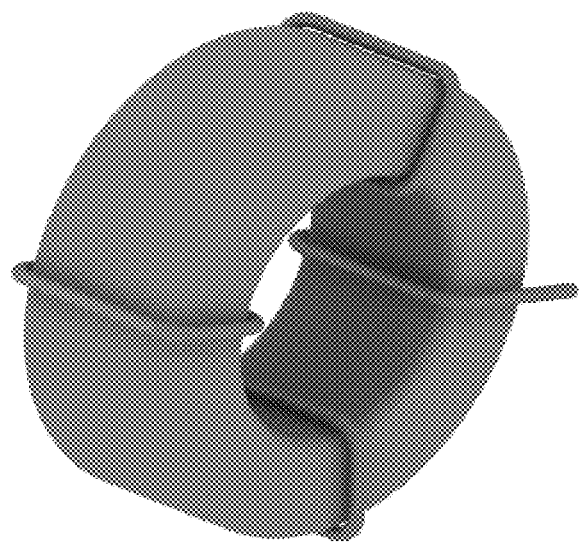
FIG. 13 illustrates a perspective view of 3 wind ferrite toroid.

FIG. 13 shows a perspective view of a 3 wind ferrite core.

Figure 14:
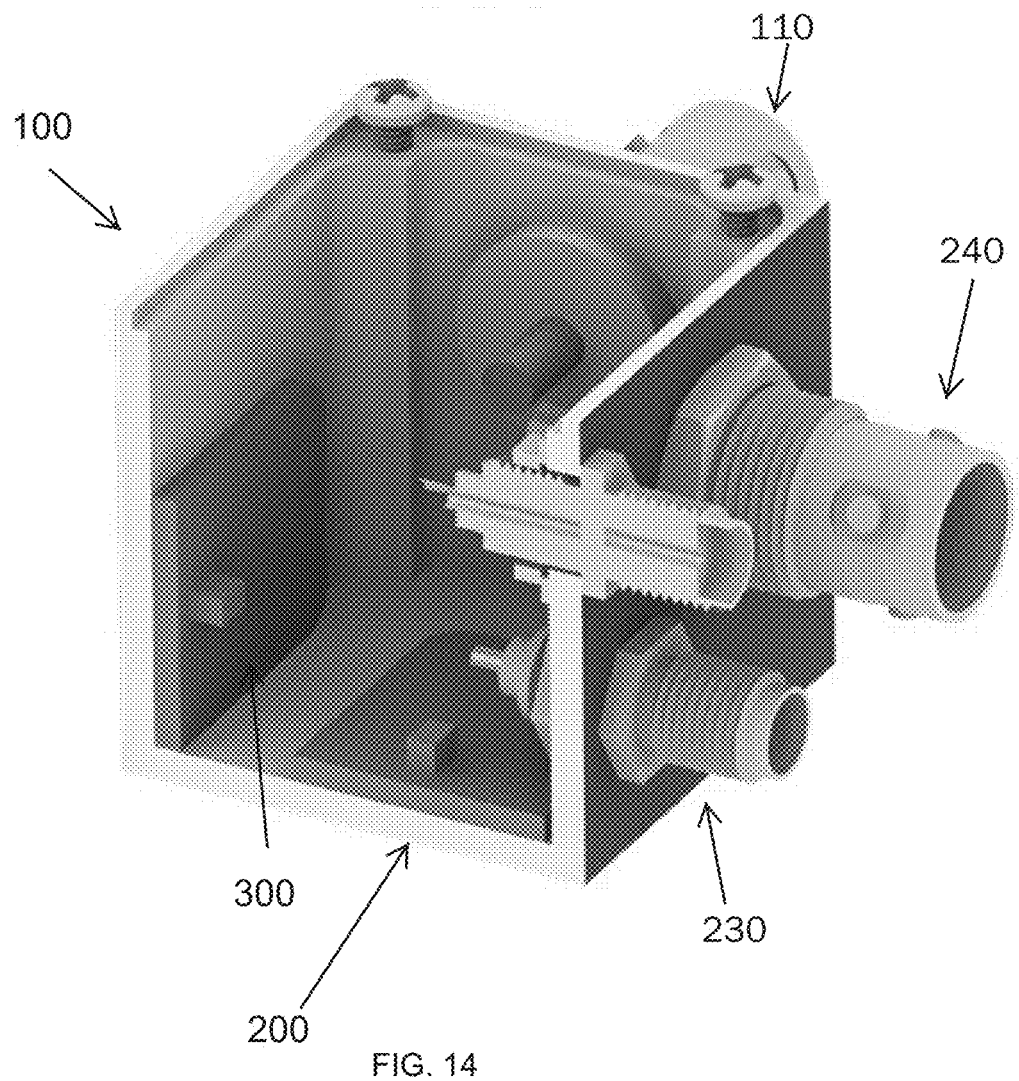
FIG. 14 is a partially perspective view of the LNAs, and SMA connectors.

FIG. 14 shows a cutaway perspective view of the connectors 110, 230, and 240 mounted and sealed through openings in the coupler box 100, without the interior wiring, but with the LNA circuit boards 200 and 300.

Figure 15:
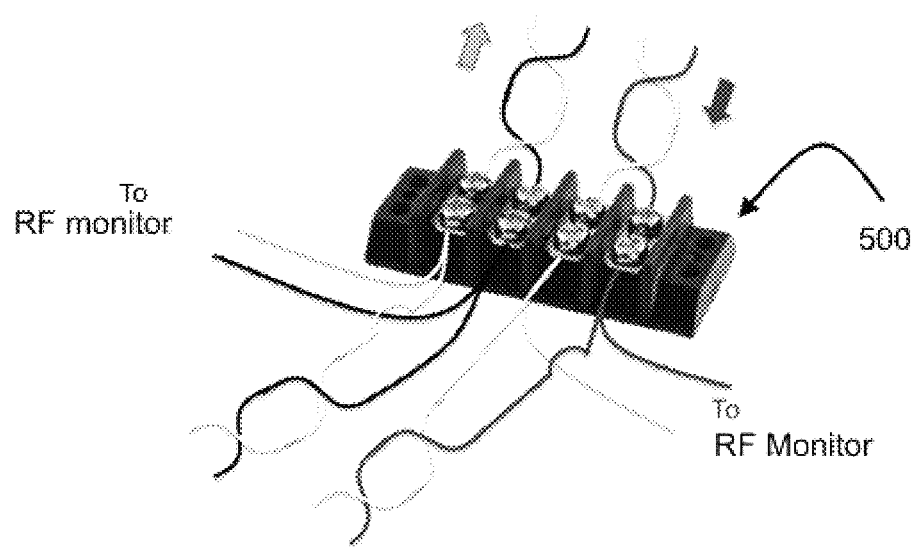
FIG. 15 illustrates a perspective view of a terminal block.
Figure 16:
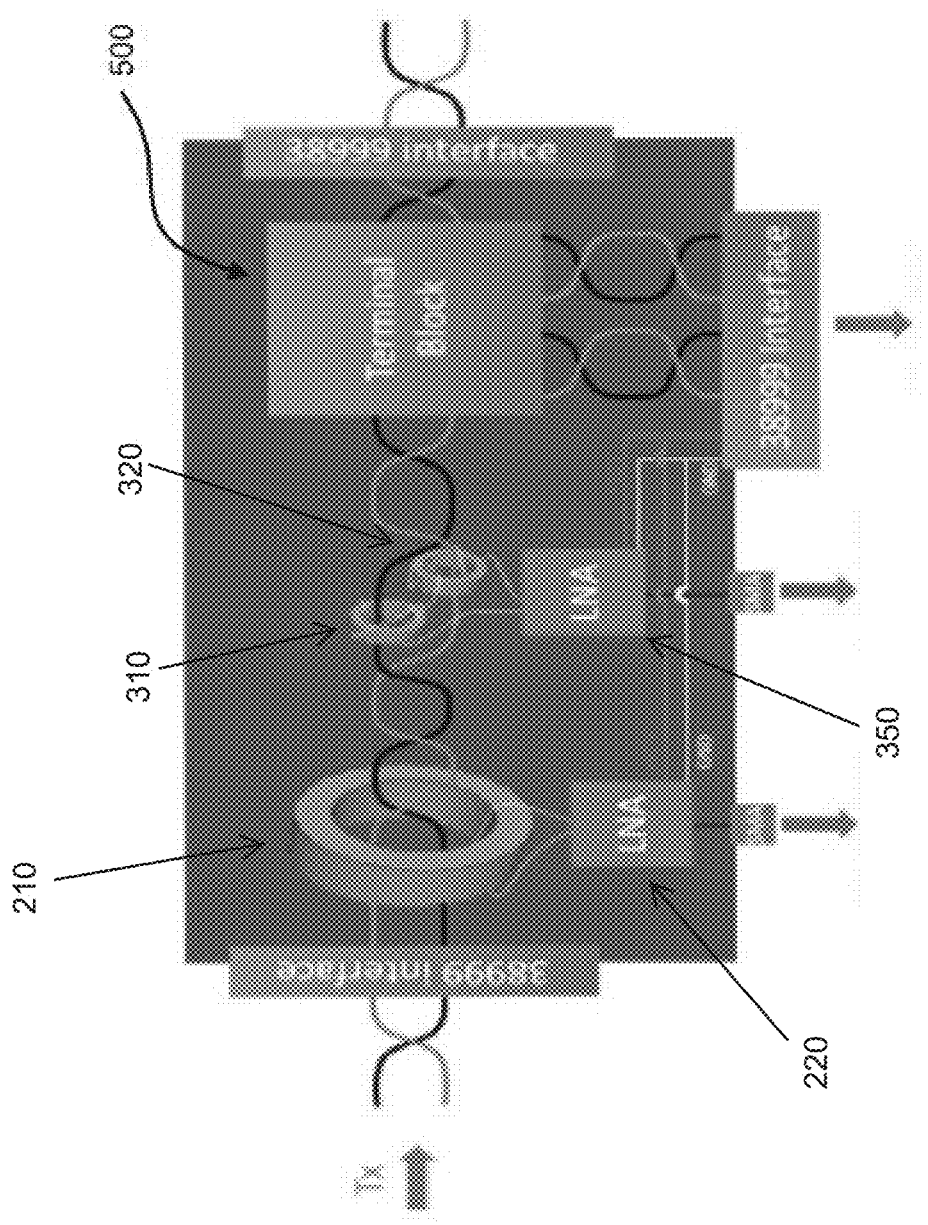
FIG. 16 illustrates a unidirectional block diagram.

The A429 data bus operates at a generally 100 KHz. Monitoring of the A429 data bus uses a terminal block 500, see FIG. 15. The terminal block 500 is preferably fit into the bus coupler box 100 as shown in FIG. 16. The A429 data bus coupler does not require a transformer, but can be connected directly to the unidirectional data bus. Therefore, no transformer 150 is necessary as it uses a direct connection. The A429 data bus (Tx) continues through the coupler box 100 and is connected to the data bus output connector, as shown by arrow from 38999 interface in FIG. 16, without corrupting the signals or compromising security.

Figure 18C:
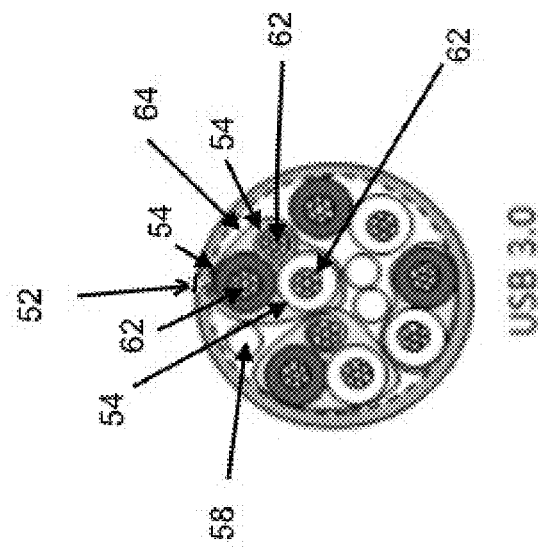
FIG. 18C illustrates a cross sectional view of a USB data base cable.
Figure 18B:
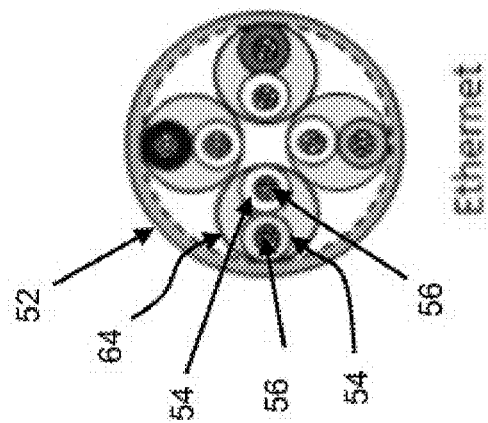
FIG. 18B illustrates a cross sectional view of an Ethernet data bus cable.
Figure 18A:
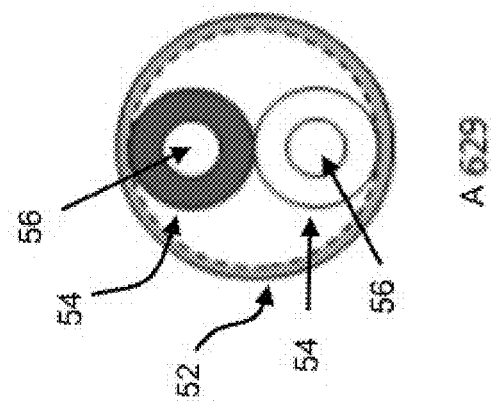
FIG. 18A illustrates a cross sectional view of an A629 data bus cables.
Figure 19A:
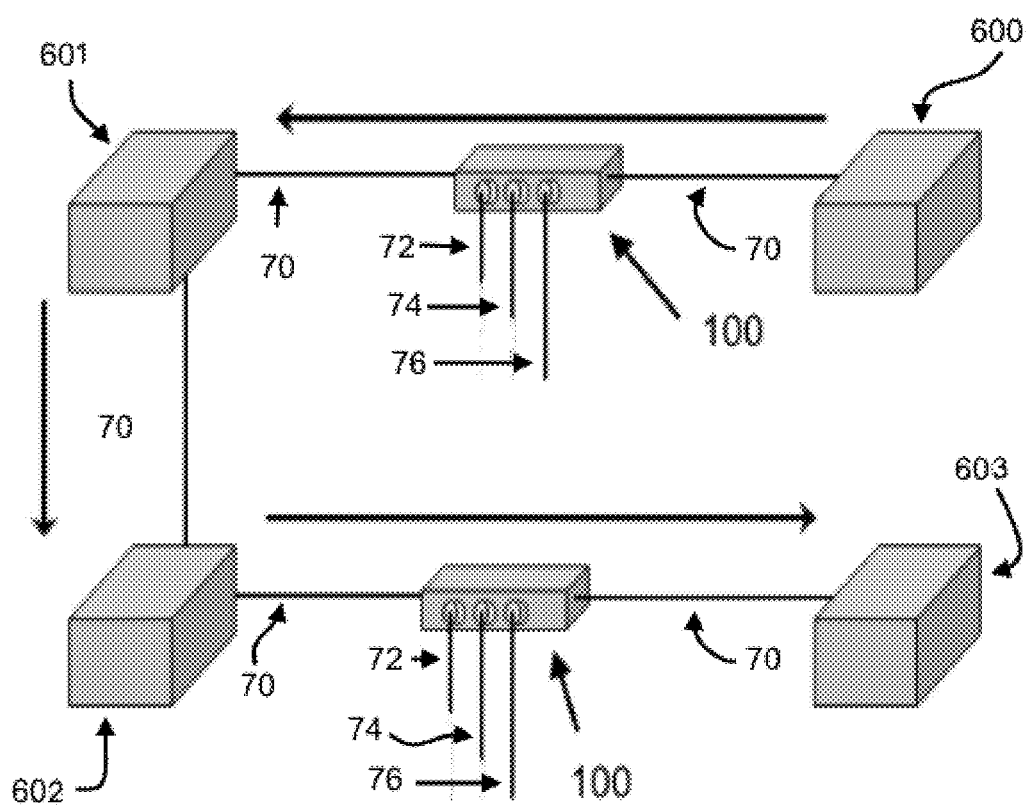
FIG. 19A illustrates a block diagram of the device connected to LRUs in a preferred embodiment.
Figure 19:
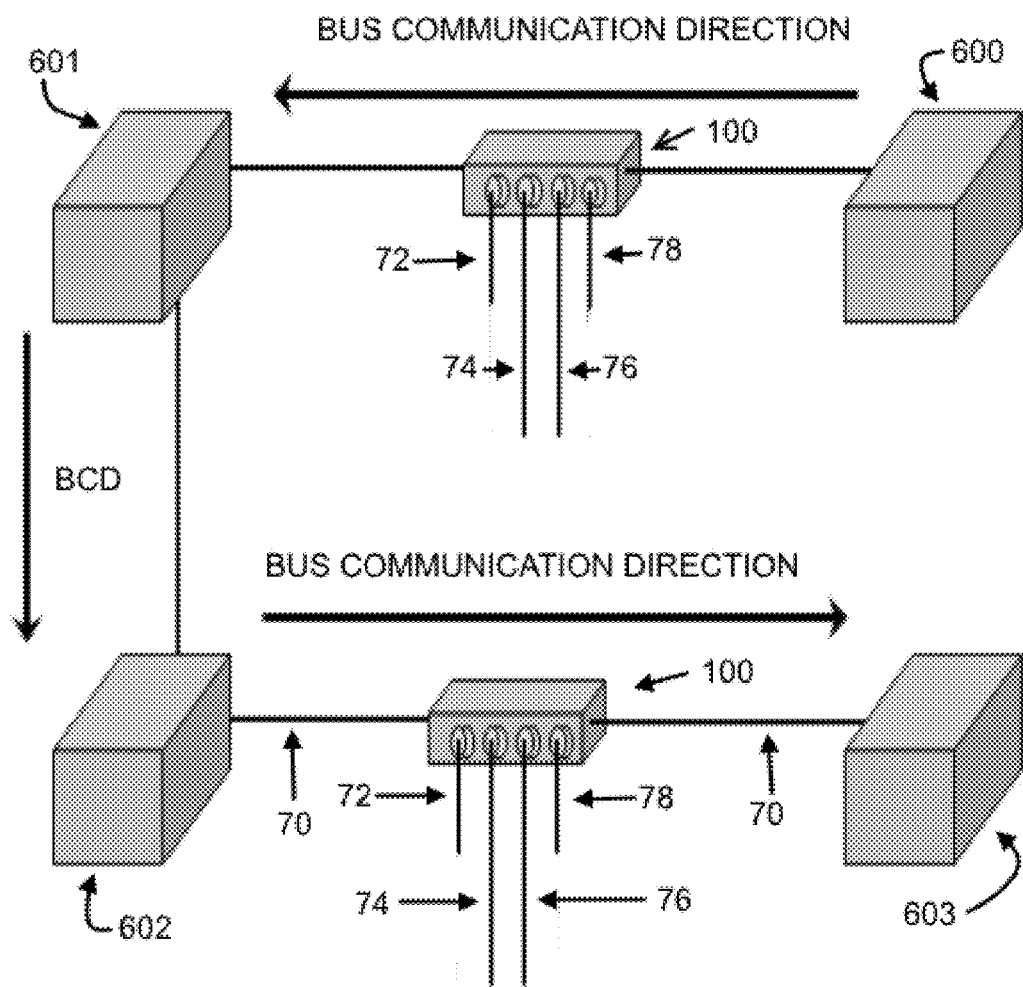
FIG. 19B illustrates a block diagram of the device connected to LRUs in a preferred embodiment. with communications output.
Figure 20A:
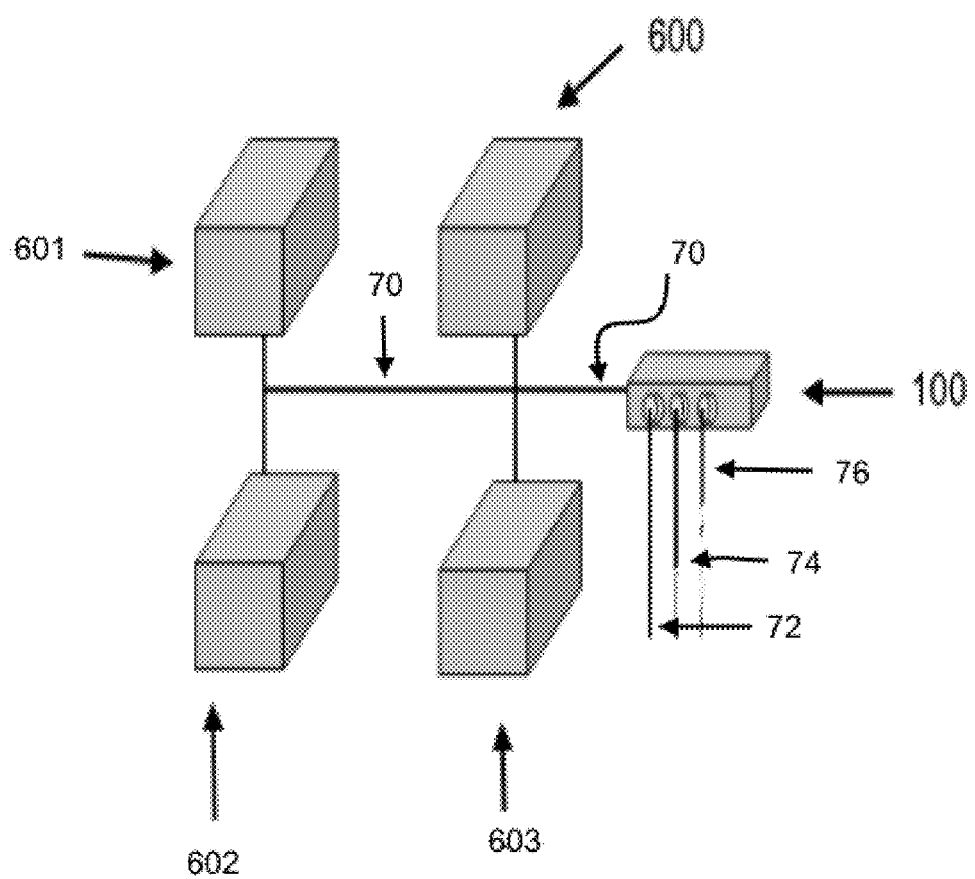
FIG. 20A illustrates a block diagram of the device connected to LRUs is a second embodiment with communications output.
Figure 20:
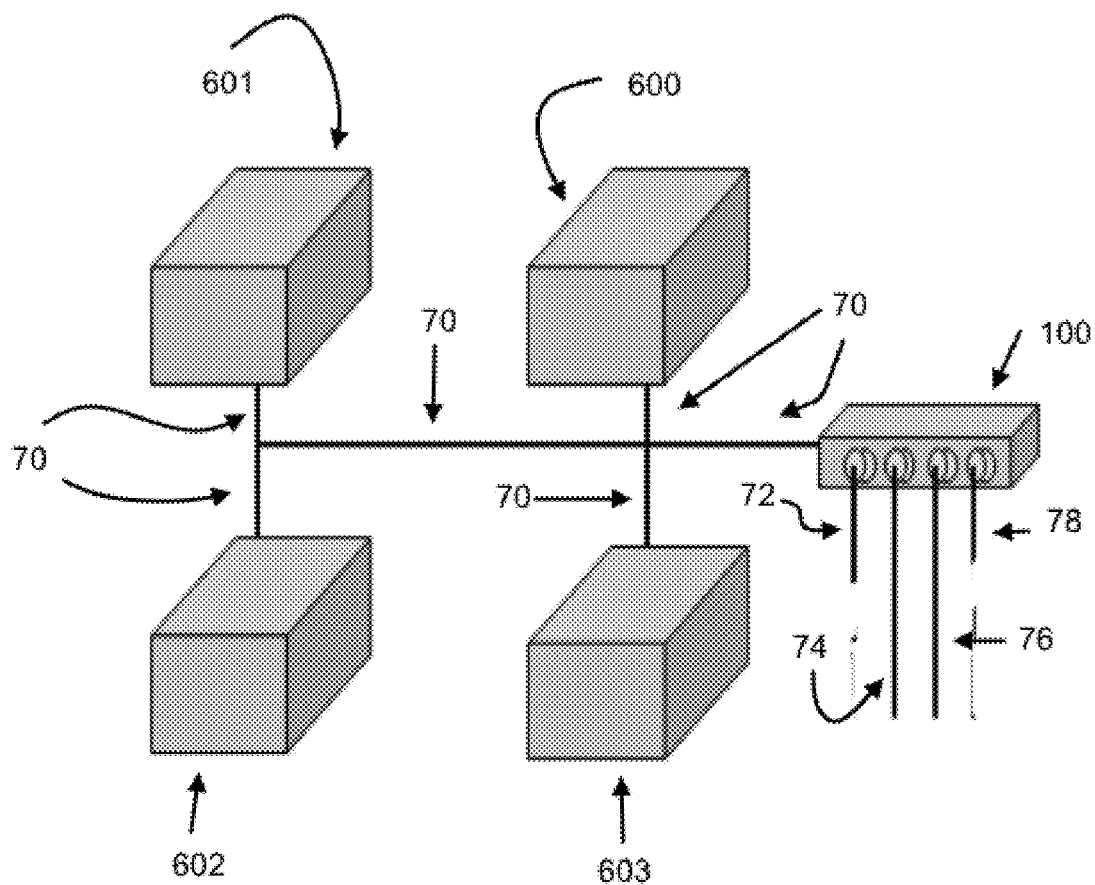
FIG. 20B illustrates a block diagram of the device connected to LRUs is a second embodiment with communications output.
Figure 21A:
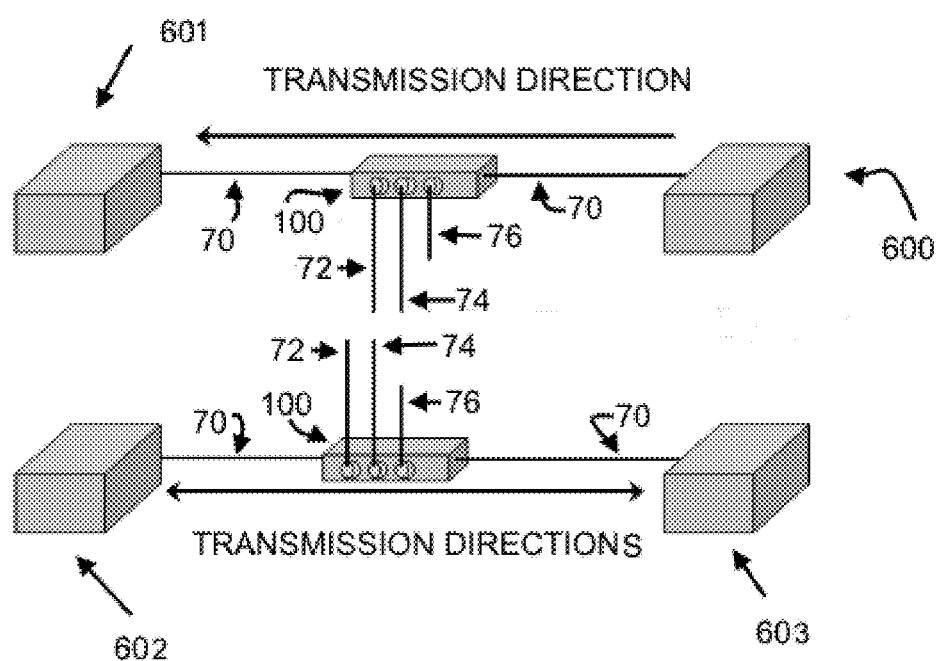
FIG. 21A illustrates a block diagram the device connected to LRUs in a 3rd Embodiment.
Figure 21:
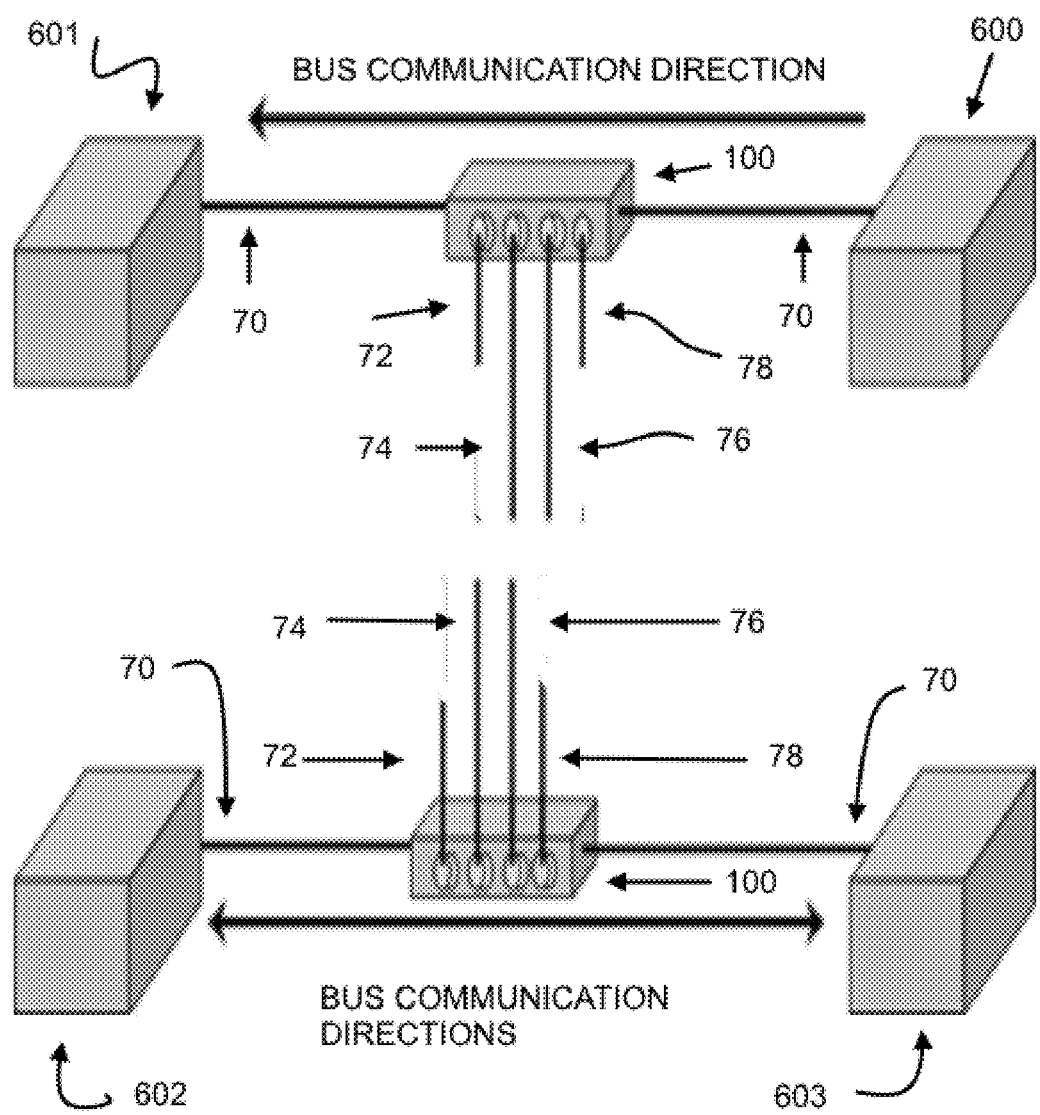
FIG. 21B illustrates a block diagram the device connected to LRUs in a 3rd Embodiment with communications output.
Figure 22A:
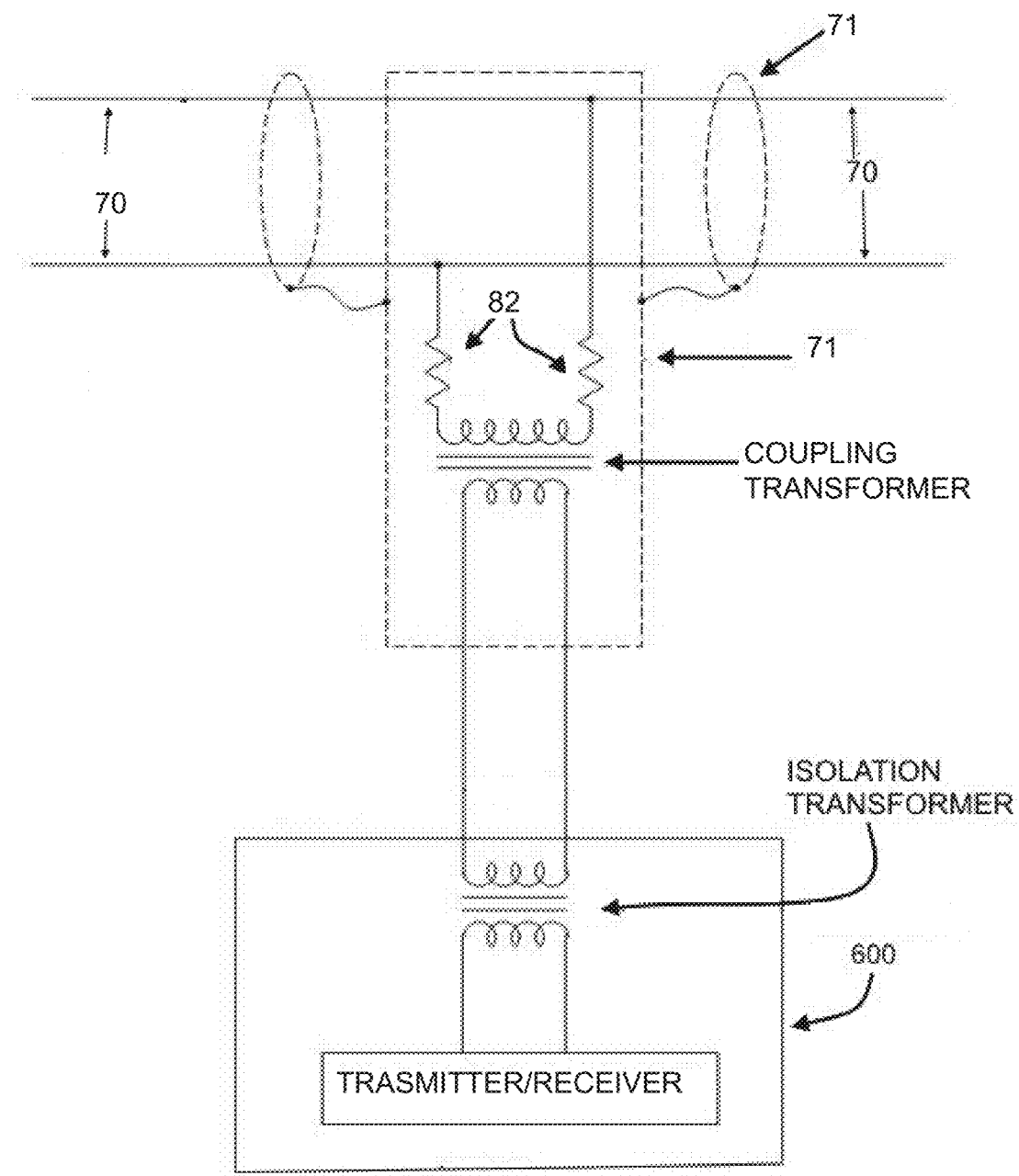
FIG. 22A illustrates a diagram of a 1553 data bus with a coupled transformer.
Figure 22B:
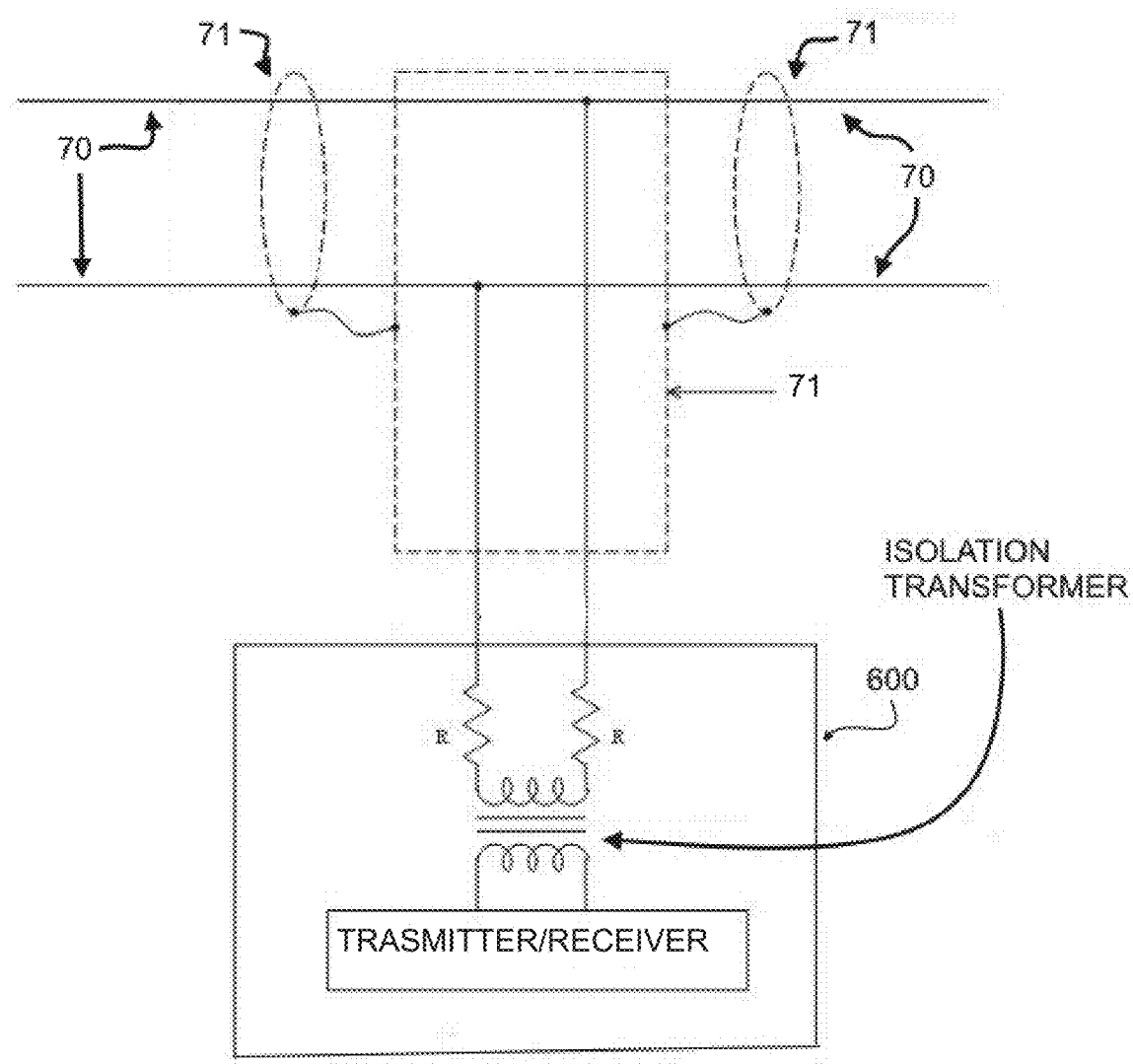
FIG. 22B illustrates a diagram of a 1553 data bus with a direct connection and isolating resistors.

The invention can extract unintentional analog signals and digital signals from multiple buses. The monitoring can be for a single bus individually or for a number of busses simultaneously. FIG. 17A shows the cross section of MIL-STD-1553 data bus, FIG. 17B shows the A429 data bus, FIG. 17C the CAN Bus (single pair) and FIG. 17D shows the CAN Bus (dual pair). All of these buses have a shield 52. Inside the shield 52 are conductors 56 that each have a shielded jacket 54. The MIL-STD-1553 data bus, and the CAN Bus (single pair and dual pair) there are spacers 58 to hold the conductors in place. Similarly, in FIG. 18A shows the A629, FIG. 18B the ethernet, and FIG. 18C the USB data buses are shown in cross sections have a shield 52. The A629 bus also has conductors 56 surrounded by shielded jackets 54. The ethernet and USB data buses have multi-filament conductors 62. The ethernet bus has 4 multi-filament conductors 62 surrounded by a shielded jacket 54. The USB 3.0 data bus has two 3 member multi-filament conductors 62 packages and two 2 member multi filament conductors 62 each in separate packages 64, each conductor package surrounded by a package shield 64. Each of the USB 3.0 conductors is also shielded with a shielded jacket 54. The packages are held in place with spacers 58.

Though the invention is described with regards to buses, networks of communication networks the invention can be used to measure any conductor or a plurality of conductors that at least one of have data or information flowing on them or do not have information intentionally flowing on them. As an example, a conductor that is situated directly adjacent to a conductor containing communication will couple both the communication signal, noise or weak unintended analog signatures to adjacent conductors. The invention can be configured to monitor at least one of the conductors over which the communications signal directly flows or the adjacent conductors whether those conductors are intended to have communications or data flowing on them or not. For example, the CMP can be configured to monitor at least one of one or multiple ground conductors or shields in a communication cable without monitoring directly the conductor that the communications flow over.

The invention is usable with data buses and networks in general and with one or more of the MIL-STD-1553 data bus, ARINC 429 (A429) bus, CAN (and its variants), A629, ethernet, USB, optical, serial and Universal Powerline Buses.

Although specific advantages have been enumerated above, various embodiments may include some, none, or all of the enumerated advantages. Other technical advantages may become readily apparent to one of ordinary skill in the art after review of the following figures and description.

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Unless otherwise specifically noted, articles depicted in the drawings are not necessarily drawn to scale.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

We claim:

1. A device to simultaneously extract and amplify unintended analog signals and digital signals on a data bus, the device comprising:
    a shielded coupler box having walls, an exterior, and an interior;
    a common mode probe (CMP) and a differential mode probe (DMP);
    a plurality of connectors through the walls of the shielded coupler box to receive cables exterior to the shielded coupler box, the plurality of connectors comprising: at least one input connector configured to receive each data bus wire pair exterior to the shielded coupler box, at least one data bus output connector configured to receive the each data bus wire pair exterior to the shielded coupler box, a power supply connector configured to receive a power source, a connector configured to receive a CMP output, and a connector configured to receive a DMP output;
    the each data bus wire pair comprising at least one unshielded wire pair having a first unshielded wire and a second unshielded wire, each attached to a data bus input connector and a data bus output connector interior to the shielded coupler box;
    the CMP having one of a non-contact CMP inductive coil and capacitive electrical probe in close proximity to both the first unshielded wire and second unshielded wire and the DMP having a first non-contact DMP inductive coil in dose proximity to the first unshielded wire and a second non-contact DMP inductive coil in close proximity to the second unshielded wire;
    a first conductor wound around the non-contact CMP inductive coil and a second conductor wound around first and second non-contact DMP inductive coils;
    a first Low Noise Amplifier (LNA) connected to said power supply connector, connected to the first conductor as an input and connected to the CMP output; and
    a second LNA connected to said power supply connector, connected to the second conductor and connected to said DMP output;
    the device designed to simultaneously extract and amplify unintended analog signals and digital signals on the data bus.

2. The device according to claim 1 further having a digital output coupled to the data bus.

3. The device according to claim 2 wherein said digital output is isolated from the data bus is by one of an isolating transformer and isolating resistors.

4. The device according to claim 1 further comprising an isolating transformer connected between the first unshielded wire and the second unshielded wire and a digital output connector.

5. The device according to claim 1 wherein said non-contact CMP inductive coil and said first and second non-contact DMP inductive coils being disposed generally normal to the first and second unshielded wires and are offset from each other.

6. The device according to claim 1 wherein said first conductor is wrapped a plurality of turns around the non-contact CMP inductive coil.

7. The device according to claim 1 wherein the first conductor is wrapped between 1 and 3 turns around the non-contact CMP inductive coil.

8. The device according to claim 1 wherein said second conductor is wrapped a plurality of turns around the first non-contact DMP inductive coil and the second non-contact DMP inductive coil.

9. The device according to claim 1 wherein the second conductor is wrapped between 1 and 3 turns around the first non-contact DMP inductive coil and the second non-contact DMP inductive coil.

10. The device according to claim 1 wherein windings of the second conductor around the first non-contact DMP inductive coil and windings of the second conductor around the second non-contact DMP inductive coil are wound in opposite rotational directions.

11. The device according to claim 1 wherein said non-contact CMP inductive coil has a ferrite core.

12. The device according to claim 1 wherein said non-contact CMP inductive coil has a generally toroidal ferrite core.

13. The device according to claim 1 wherein said first and second non-contact DMP inductive coils have a magnetic core.

14. The device according to claim 1 wherein said first and second non-contact DMP inductive coils have ferrite cores.

15. The device according to claim 1 wherein each of said first and second non-contact DMP inductive coils have generally toroidal ferrite cores.

16. The device according to claim 1 wherein said shielded coupler box is grounded and manufactured of an electrically conductive material and said first and second LNAs are electrically connected to said shielded coupler box and grounded.

17. The device according to claim 1 wherein said shielded coupler box is manufactured of an electrically conductive material and each of said first and second LNAs is attached to said shielded coupler box with an electrically insulating adhesive.

18. The device according claim 1 wherein said shielded coupler box is manufactured of a thermally conductive material and said first and second LNAs are adjacent to said shielded coupler box so that said shielded coupler box is a heat sink.

19. The device according claim 1 wherein said shielded coupler box is manufactured of a thermally conductive material and said first and second LNAs are each attached to said shielded coupler box by a thermally conductive adhesive so that the shielded coupler box is a heat sink.

20. The device according to claim 1 to extract RF signals from one or more of MIL-ST-1153, A429, A629, USB, Universal Powerline Bus, Optical network, CAN data buses.

21. The device according to claim 1 wherein the first and second conductors are connected to a terminal block, the terminal block is also connected to digital output ports.

22. The device according to claim 21 where at least one of a CMP and DMP uses at least one of inductive or capacitive coupling to extract weak analog signatures from a communication architecture.

23. The device of claim 22 where extracted weak analog signatures are used for at least one of cyber monitoring, cyber intrusion monitoring, health monitoring, anomaly monitoring, status monitoring or quality control.

24. The device of claim 21 where extracted analog signatures are connected to at least one LNA to amplify the extracted analog signatures for analysis.

* * * * *